United States Patent
Lu et al.

(10) Patent No.: US 7,043,223 B2
(45) Date of Patent: May 9, 2006

(54) SUPER-REGENERATIVE RADIO FREQUENCY RECEIVER AND ITS DATA RECEIVING METHOD

(75) Inventors: Yi Lu, Hsinchu (TW); Yung-Chow Peng, Hsinchu (TW)

(73) Assignee: Winbond Electronics Corp., Hsinchu (TW)

(*) Notice: Subject to any disclaimer, the term of this patent is extended or adjusted under 35 U.S.C. 154(b) by 454 days.

(21) Appl. No.: 10/632,194

(22) Filed: Jul. 31, 2003

(65) Prior Publication Data
US 2004/0229585 A1    Nov. 18, 2004

Related U.S. Application Data

(60) Provisional application No. 60/470,800, filed on May 14, 2003.

(30) Foreign Application Priority Data
May 14, 2003   (TW) ............................... 92113058 A

(51) Int. Cl.
H04B 1/16    (2006.01)

(52) U.S. Cl. ...................... 455/336; 455/337; 455/218; 455/220

(58) Field of Classification Search ............... 455/336, 455/334, 337, 254, 212, 214, 215, 218–225; 342/20, 89, 90; 332/138, 139, 141
See application file for complete search history.

(56) References Cited

U.S. PATENT DOCUMENTS

| | | | | |
|---|---|---|---|---|
| 3,746,999 A | * | 7/1973 | Freen | 455/334 |
| 4,749,964 A | * | 6/1988 | Ash | 331/107 A |
| 5,742,902 A | * | 4/1998 | Shore | 455/336 |
| 5,946,609 A | * | 8/1999 | Morey | 455/336 |
| 5,969,545 A | * | 10/1999 | Assadian et al. | 327/62 |

* cited by examiner

Primary Examiner—Duc M. Nguyen
(74) Attorney, Agent, or Firm—J.C. Patents

(57) ABSTRACT

A high sensitivity of a Super-Regenerative Radio Frequency Receiver and its method is provided in the embodiment of the present invention. By using a common-mode feedback circuit and by replacing the rectifier with a feedback integral-rectifier, the rectifier, the low-pass filter, and the slicer will not be saturated during operation so that the output of the slicer is correctly generated, and the sensitivity of the Super-Regenerative Radio Frequency Receiver is greatly improved as a result.

16 Claims, 9 Drawing Sheets

SUPER-REGENERATIVE RADIO FREQUENCY RECEIVER AND ITS DATA RECEIVING METHOD

CROSS-REFERENCE TO RELATED APPLICATION

This application claims the priority benefits of U.S. provisional application titled" "SUPER-REGENERATIVE RADIO FREQUENCY RECEIVER AND THE DATA RECEIVING METHOD THEREOF" filed on May 14, 2003, Ser. No. 60/470,800. All disclosure of this application is incorporated herein by reference. This application also claims the priority benefit of Taiwan application serial No. 92113058, filed May 14, 2003.

BACKGROUND OF THE INVENTION

1. Field of the Invention

The present invention pertains to a Radio Frequency Receiver in general, and more particularly to a Super-Regenerative Radio Frequency Receiver and its data receiving method.

2. Description of the Related Art

An On-Off Keying (OOK) Radio Frequency Receiver is commonly found in a remote control application, such as a low-speed-command-control electronic device or toy car. In FIG. 1, an OOK modulated signal is presented. In the figure, clearly, an OOK modulated signal is a carrier frequency been modulated in a binary code. During an OOK modulated signal in transmission, on a transmitter, corresponding to a low period of the binary code, a low period OOK modulated signal containing no carrier frequency is transmitted. Corresponding to a high period of the binary code, a high period OOK modulated signal containing carrier frequency is transmitted. On a receiver, the strength of the transmitted signal varies depending upon the distance between the transmitter and the receiver. Then, an oscillator in the receiver will oscillate faster or slower according to the strength of a received signal. From the oscillating speed of the oscillator, the receiver distinguishes logic 1 from logic 0. Apparently, it is difficult for the receiver to differentiate a weak signal from logic zeros, and it is easy for the receiver to differentiate a strong signal from logic zeros. Therefore, a better performance can be achieved by setting the receiver to its most sensitive condition if the receiver can be controlled to operate normally without running to a saturation condition.

FIG. 2 demonstrates a widely used Super-Regenerative Radio Frequency Receiver in a block diagram. As depicted in FIG. 2, a Super-Regenerative Radio Frequency Receiver 20 contains an oscillator 202, capacitor 204, low-pass filter 206, and slicer 208, where the low-pass filter 206 contains a resistor 210 and a capacitor 212. The Super-Regenerative Radio Frequency Receiver is described by parts as follows.

The oscillator 202 produces an oscillating output signal according to a radio frequency signal and a quench signal. The radio frequency signal, the quench signal, and the oscillating output signal in FIG. 2 are depicted in FIG. 3 respectively. The quench signal is a saw-wave signal with a frequency close to 400 hertz (Hz). As the radio frequency signal at a low period that is at logic 0 of the binary code, the oscillating frequency of the oscillating output signal will slow down, and as the radio frequency signal a high period that is at logic 1 of the binary code, the oscillating frequency of the oscillating output signal will increase.

The capacitor 204 is an alternating current (AC) coupling capacitor; thereby, it filters out a direct current (DC) component of the oscillating output signal, and by-passes a AC component of the oscillating output signal. The low-pass filter 206 filters out an unwanted AC component of the oscillating output signal to obtain a desired frequency band of the oscillating output signal. The slicer 208 is used to slices the oscillating output signal. Then, after the oscillating output signal passes the slicer 208, an output data is obtained.

However, due to the big capacitance of the capacitor 204 in the Super-Regenerative Radio Frequency Receiver 20, it is not practical to fabricate the capacitor in an integrated circuit (IC). Similar to the resistor 210 and the capacitor 212, for a high resistance and a high capacitance are required to build a low-pass filter, the resistor 210 and the capacitor 212 of the low-pass filter 206 are also not practical to be built in an IC. As a result, an extra size IC would be made if the Super-Regenerative Radio Frequency Receiver 20 were built in an integrated circuit.

Referring to FIG. 4, the block diagram depicts another commonly used Super-Regenerative Radio Frequency Receiver. From FIG. 4, the Super-Regenerative Radio Frequency Receiver 40 contains Low Noise Amplifier (LNA) 402, oscillator 404, Envelope Detector 406, low-pass filter 408, slicer 410, two Automatic Gain Control (AGC) filters 412, 416, two voltage-to-current transformers 414, 418. The AGC filters 412, 416 consist of low-pass filters to obtain the rectifiered signal energy level. In the Super-Regenerative Radio Frequency Receiver 40, when the radio frequency signal contains various amplitudes of components and causes the oscillator to output various amplitudes oscillating signals to the Envelope Detector 406, the wide range varying signal outputted from the Envelope Detector 406 causes the common mode voltage of the output signal of the low-pass filter 408 varying in a big range, and causes the low-pass filter 408 and the slicer 410 saturated. As a consequence, the output of the slicer 410 contains unacceptable errors. In additional to the various amplitudes of the radio frequency components resulting in the saturation of the low-pass filter 408 and the slicer 410, the variation during the Super-Regenerative Radio Frequency Receiver 40 fabrication procedure will make the saturation problem worse. Therefore, the various amplitudes of the radio frequency components and the fabrication procedure reduce the sensitivity of the Super-Regenerative Radio Frequency Receiver 40.

SUMMARY OF THE INVENTION

As the problems point out in the prior art section, the embodiment of the present invention provides a data receiving method and an improved Super-Regenerative Radio Frequency Receiver. The embodiment of the present invention uses a common mode feedback circuit and replaces the rectifier by an integral-rectifier to improve the sensitivity of the Super-Regenerative Radio Frequency Receiver.

The embodiment of the present invention provides a Super-Regenerative Radio Frequency Receiver that contains an oscillator, a rectifier, low-pass filter, and a common-mode feedback circuit. The oscillator bases on the radio frequency signal and the quench signal to obtain the oscillating output. The rectifier is coupled to oscillator to obtain the rectifier output based on the oscillation output signal. The low-pass filter is coupled to the rectifier to obtain the data output signal by filtering out the rectifier output signal. The common-mode feedback circuit is coupled to the low-pass filter and the rectifier, and is used to rectify the common-mode voltage of the data output signal and to provide the common-mode feedback signal to the rectifier. The rectifier receives the common-mode feedback signal to adjust the rectifier output signal.

In the preferred embodiment of the present invention, the common-mode feedback signal is a common-mode feedback current. The rectifier contains a reference current source, current adder circuit, and a pseudo differential rectifier. The reference current source is used to offer a reference current level. The current adder circuit coupled to the reference current source is used to add up the reference current and the common-mode feedback current, and outputs an operating current. The pseudo differential rectifier coupled to the current adder circuit is used to rectify the output from the oscillator to obtain the rectified signal while the pseudo differential rectifier is based on the magnitude of the operating current to adjust the rectified signal output voltage level.

In the preferred embodiment of the present invention, the common-mode feedback circuit contains a comparator, an amplifier, and a feedback low-pass filter. The comparator and the amplifier are used to compare and to enlarge the data signal and the reference common-mode voltage, and then to output a compare-signal. The feedback low-pass filter is coupled to the comparator and the amplifier to filter the compare-signal out and to obtain the feedback signal.

The embodiment of the present invention also provides a data receiving method of a Super-Regenerative Radio Frequency Receiver. The data receiving method is used to receive the radio frequency signal and to obtain the data signal. In the data receiving method, a quench signal is first provided. Then, according to the radio frequency signal and the quench signal, an oscillating signal is oscillated out. Next, the common-mode voltage of the data signal is examined, and the common-mode feedback signal is feed-backed. According to the oscillating output signal, the rectifier output signal is rectified, and according to the common-mode feedback signal, the rectifier output signal is adjusted. Finally, the rectifier output signal goes through a filter to obtain the data signal.

As a summary, the embodiment of the present invention utilizes the common-mode feedback circuit and changes the rectifier to an integral-rectifier with feedback functions to avoid the occurrence of saturation among the rectifier, low-pass filter, and slicer. Therefore, the errors from the output of the slicer won't occur, the sensitivity of the Super-Regenerative Radio Frequency Receiver is improved by using the embodiment of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. The drawings are as follows.

DETAILED DESCRIPTION OF SPECIFIC EMBODIMENTS

Figure 1:
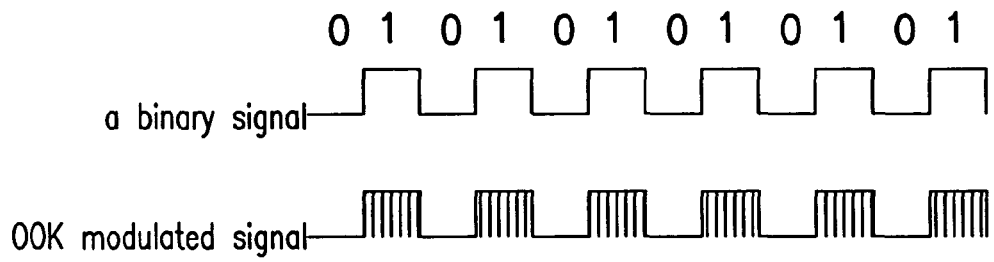
FIG. 1 demonstrates the On-Off Keying (OOK) modulated signal in a wave-form diagram.
Figure 2:
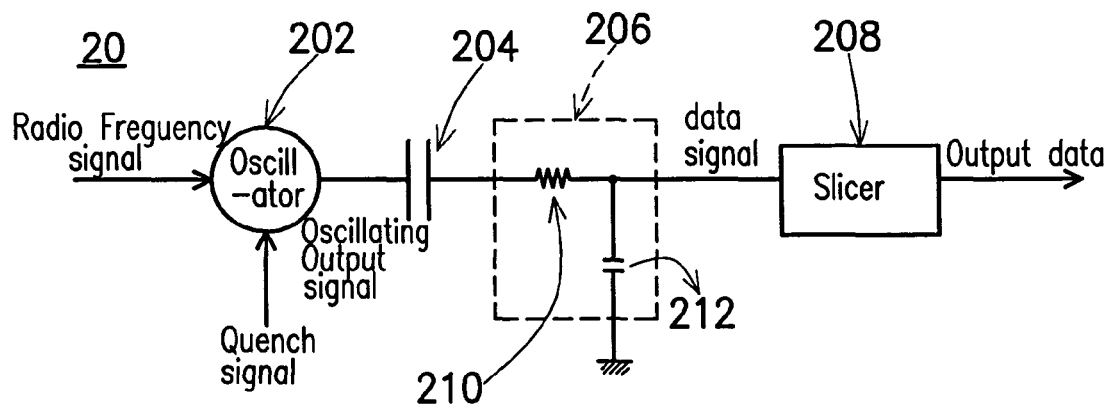
FIG. 2 depicts a commonly used Super-Regenerative Radio Frequency Receiver in a block diagram.
Figure 3:
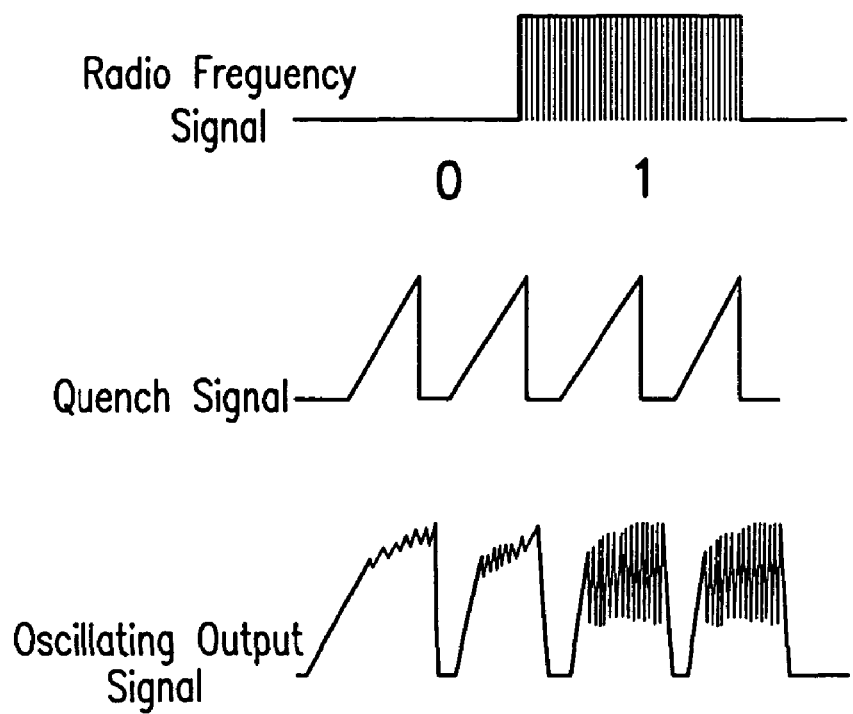
FIG. 3 demonstrates the radio frequency signal, quench signal, and oscillating output signal of FIG. 1 in a wave-form diagram.
Figure 4:
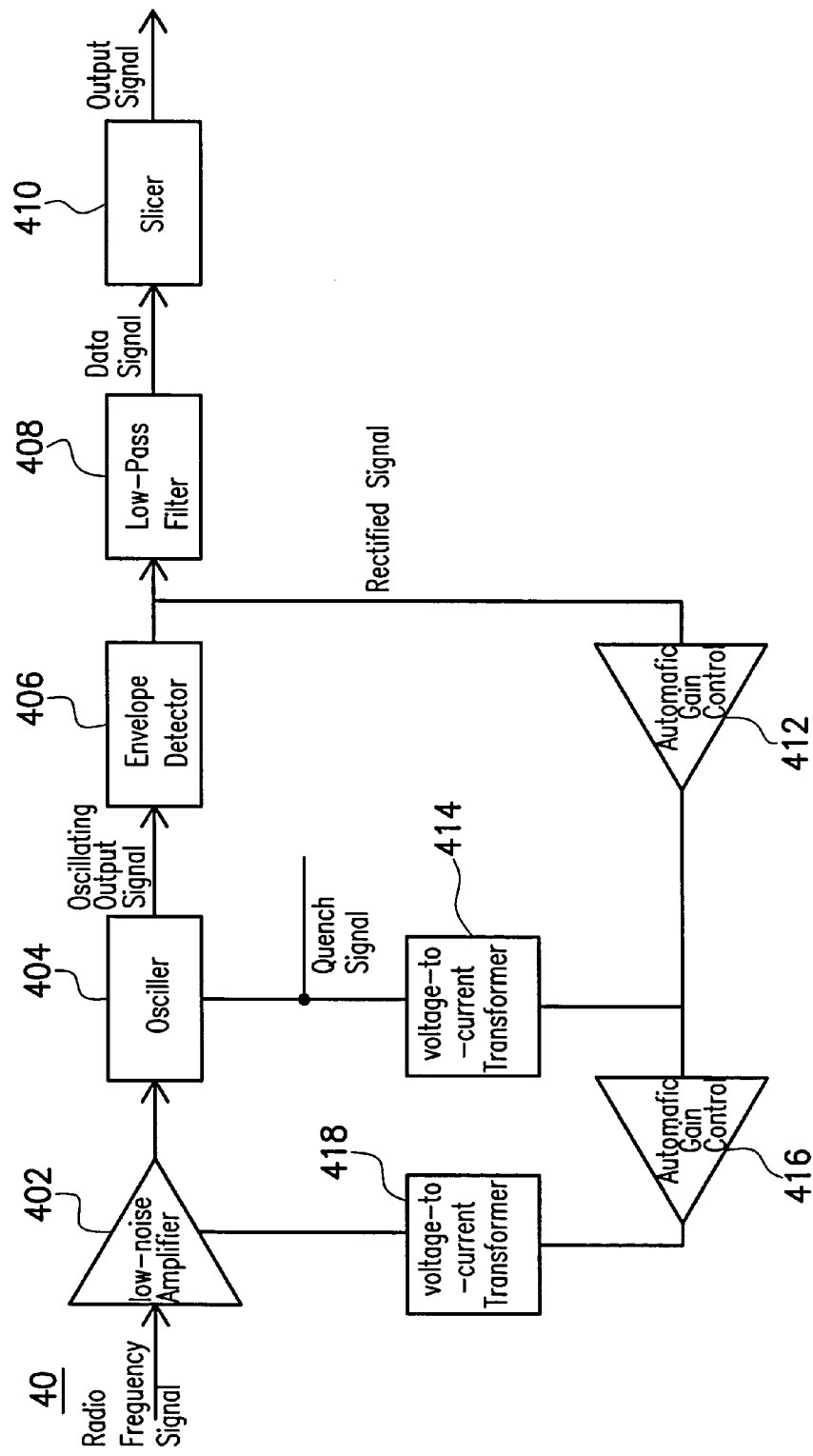
FIG. 4 depicts another commonly used Super-Regenerative Radio Frequency Receiver in a block diagram.
Figure 5:
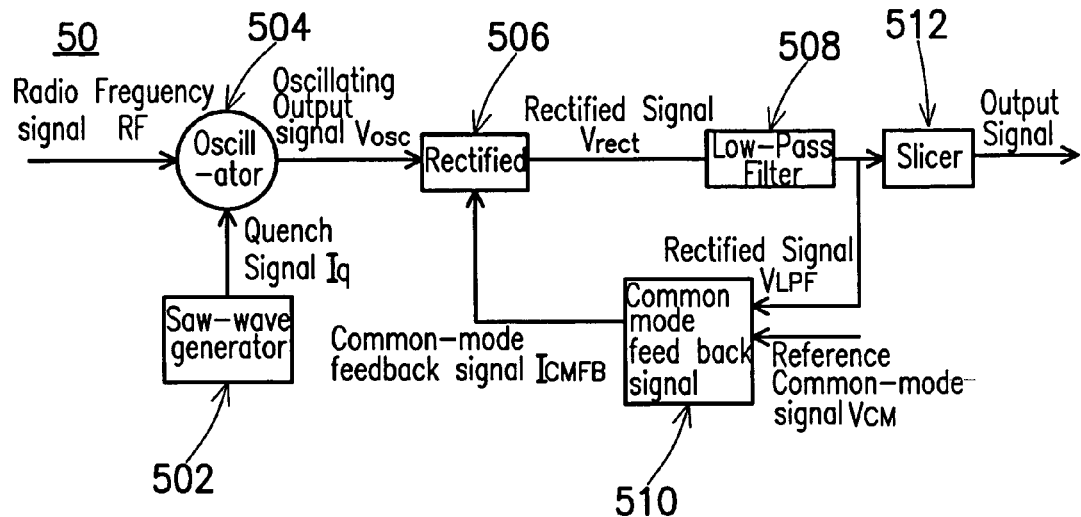
FIG. 5 depicts a Super-Regenerative Radio Frequency Receiver of the preferred embodiment of the present invention in a block diagram.

FIG. 5 depicts a Super-Regenerative Radio Frequency Receiver of the preferred embodiment of the present invention in a block diagram. In FIG. 5, the Super-Regenerative Radio Frequency Receiver 50 contains Saw-wave generator 502, oscillator 504, rectifier 506, low-pass filter 508, common-mode feedback circuit (CMFB) 510, and a slicer 512. The functionality of each element of the Super-Regenerative Radio Frequency Receiver 50 is described as follows.

The Saw-wave generator is used for generating a quench signal. In the preferred embodiment of the present invention, the quench signal is the quench current signal $I_q$ which is close to a 400 kilo-Hertz (kHz) Saw-wave signal.

The oscillator 540 coupled to the Saw-wave generator 502 outputs an oscillating output signal $V_{osc}$ according to a radio frequency (RF) signal and the quench signal $I_q$. The oscillator 540 oscillates the oscillating output signal $V_{osc}$ faster or slower according to the amplitude of the RF signal. The oscillating output signal $V_{osc}$ is a differential signal that contains an oscillating output signal $V_{osc1}$, and an oscillating output signal $V_{osc2}$.

The rectifier 506 coupled to the oscillator 504 is used to obtain a rectified signal $V_{rect}$ according to the oscillating output signal $V_{osc}$. During each period of the quench signal, the rectifier 506 integrals the oscillating output signal $V_{osc}$, and rectifies the rectified signal $V_{rect}$.

The low-pass filter 508 coupled to the rectifier 506 is used to filter out noises in higher frequency band of the rectified signal $V_{rect}$ and to obtain a data signal $V_{LPF}$.

The common-mode feedback circuit 510 coupled to the low-pass filter 508, rectifier 506, and slicer 512 is used to examine the common-mode voltage of the signal $V_{LPF}$ and to feedback the common-mode feedback signal to the rectifier 506. The rectifier 506 receives the common-mode feedback signal, and adjusts the rectified signal $V_{rect}$. In the preferred embodiment of the present invention, the common-mode feedback, signal is a common-mode feedback current $I_{CMFB}$.

The slicer 512 coupled to the low-pass filter 508 is used to slice the data signal $V_{LPF}$, and outputs digital data like a binary code as output data.

According to the above description, the biggest difference between the commonly used Super-Regenerative Radio Frequency Receiver and the Super-Regenerative Radio Frequency Receiver 50 of the preferred embodiment of the present invention is at the rectifier 506 and at the common-mode feedback circuit 510. Details of the rectifier 506 and the common-mode feedback circuit 510 are as follows.

Figure 6:
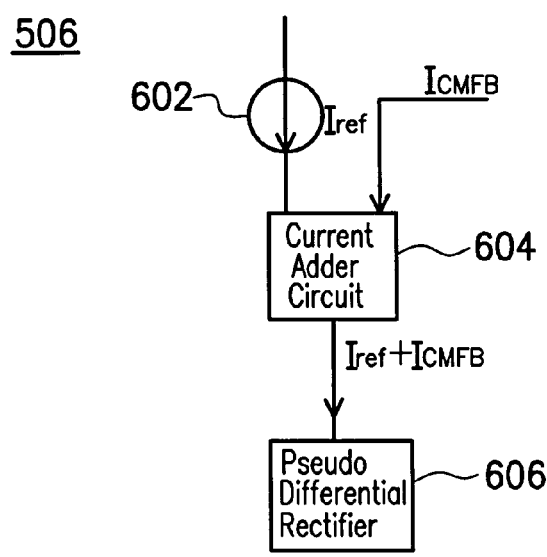
FIG. 6 depicts the rectifier of the Super-Regenerative Radio Frequency Receiver of the preferred embodiment of the present invention in a block diagram.

FIG. 6 depicts the rectifier of the Super-Regenerative Radio Frequency Receiver of the preferred embodiment of the present invention in a block diagram. As sketched in FIG. 7, the rectifier 506 contains a reference current source 602, current adder circuit 604, and a pseudo differential rectifier 606. The reference current source 602 is used to provide a reference current $I_{ref}$. The current adder circuit 604 coupled the reference current source 602 is used to add up the reference current $I_{ref}$ and the common-mode feedback current $I_{CMFB}$ and to output an operating current ($I_{ref}+I_{CMFB}$). The pseudo differential rectifier 606 coupled to the current adder circuit 604 is used to rectify the oscillator output signal $V_{osc}$, and to obtain the rectified signal $V_{rec}$. The pseudo differential rectifier 606 uses the magnitude of the operating current ($I_{ref}+I_{CMFB}$) to adjust the output voltage level of the rectified signal $V_{rect}$.

Figure 7:
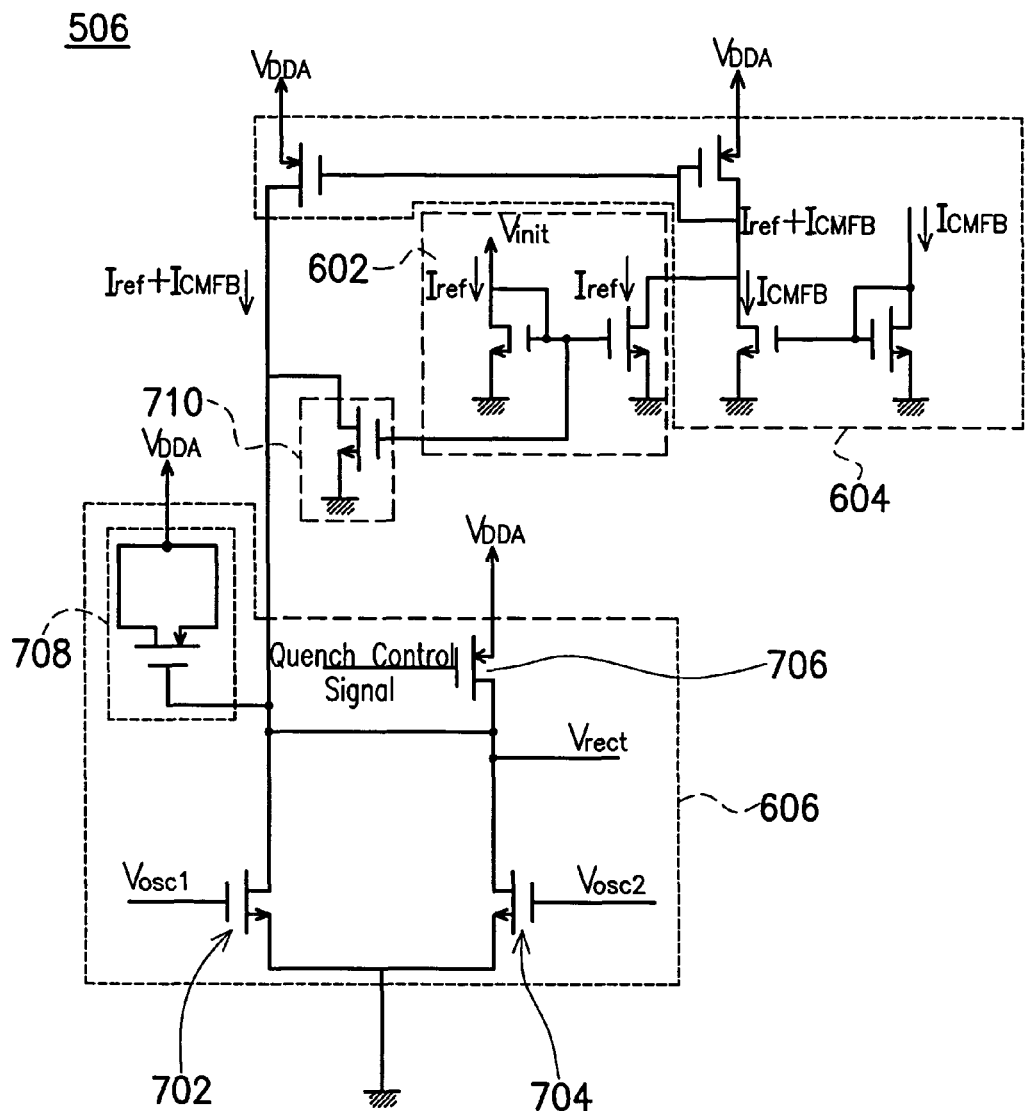
FIG. 7 depicts a detail circuit diagram of the rectifier of the Super-Regenerative Radio Frequency Receiver of the preferred embodiment of the present invention.

For a further description, the rectifier detail circuit diagram of the Super-Regenerative Radio Frequency Receiver of the preferred embodiment of the present invention is depicted in FIG. 7. In FIG. 7, the reference current source 602 made of current mirror is used to provide the reference current $I_{ref}$. The current adder circuit 604 adds up the reference current $I_{ref}$ and the common-mode feedback current ICMFB, and outputs the operating current ($I_{ref}+I_{CMFB}$) to the pseudo differential rectifier 606. The pseudo differential rectifier 606 contains three transistors 702, 704, 706, and a capacitor 708. The first source/drain of the transistor 702 is coupled to the first source/drain of the transistor 704, the first source/drain of the transistor 706, a terminal of the capacitor 708, operating current ($I_{ref}+I_{CMFB}$), and rectified signal $V_{rect}$. The second source/drain of the transistor 702 and the second source/drain of the transistor 704 are coupled to a ground reference. The gate of the transistor 702 is coupled to the oscillating output signal Vosc1. The gate of the transistor 704 is coupled to the oscillating output signal Vosc2. The gate of the transistor 706 is coupled to the quench control signal. The second source/drain of the transistor 706 and the other terminal of the capacitor 708 are coupled to a voltage power source $V_{DDA}$. The power draining circuit 710 is used for preventing the circuit elements in the pseudo differential rectifier 606 from being saturated.

From the above discussion, the rectifier 506 is a current-integral rectifier. The pseudo differential rectifier 606 increases the gain of the rectifier 506. The capacitor 708 consisting of MOS capacitors, therefore, reduces external circuit elements. Moreover, for the rectifier 506 won't be saturated, the unsaturated rectifier 506 prevents low-pass filter 508 and the slicer 512 from being saturated so that the slicer 512 won't provide error signal and the sensitivity is improved.

Figure 8:
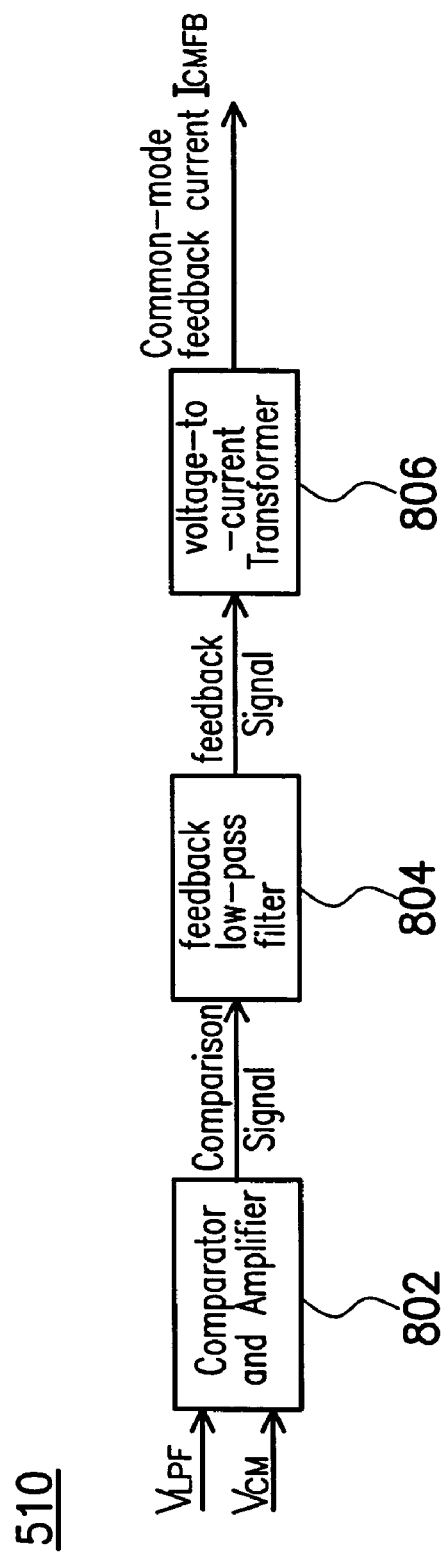
FIG. 8 depicts the common-mode feedback circuit of the Super-Regenerative Radio Frequency Receiver of the preferred embodiment of the present invention in a block diagram.
Figure 9:
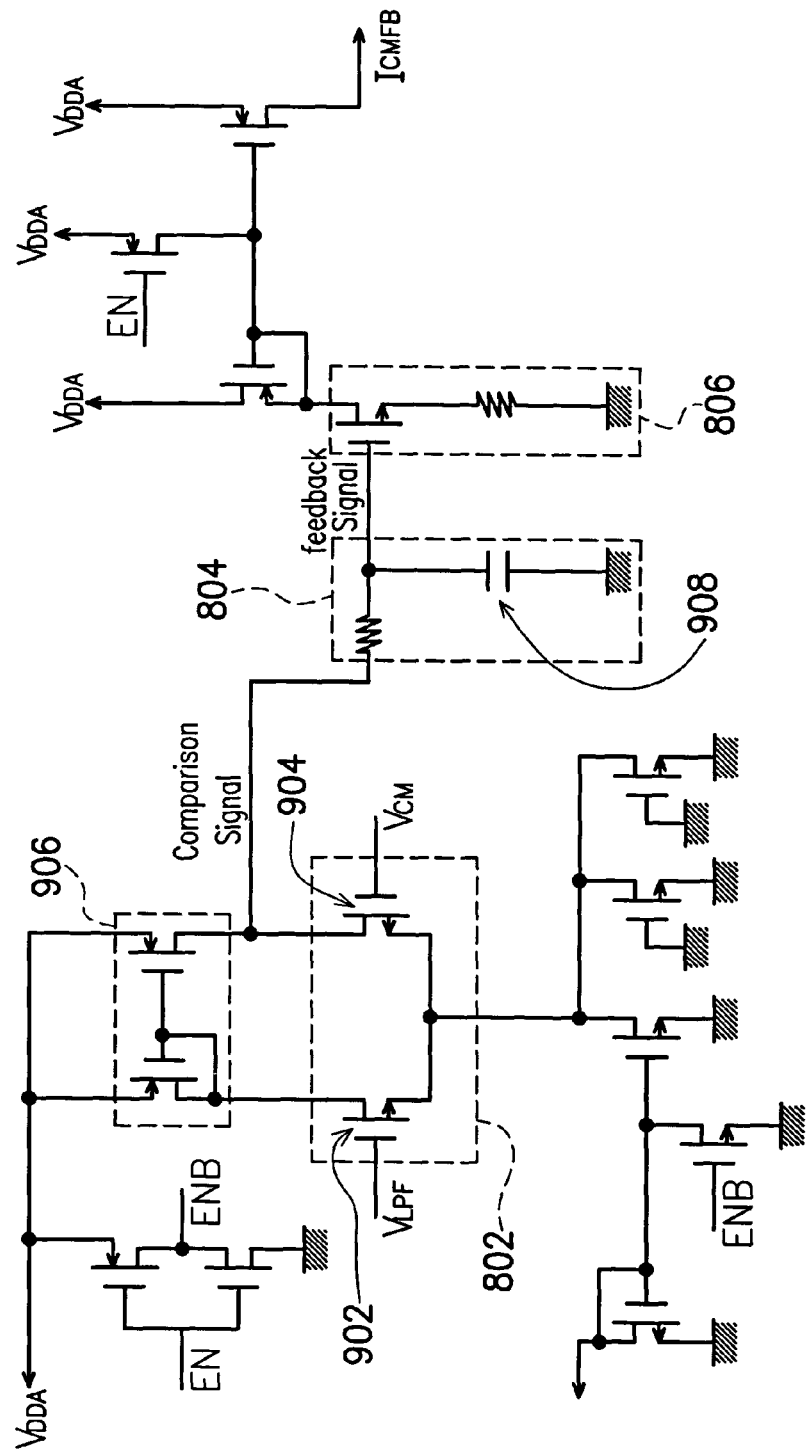
FIG. 9 depicts a detail circuit diagram of the common-mode feedback circuit of the Super-Regenerative Radio Frequency Receiver of the preferred embodiment of the present invention.

Next, FIG. 8 demonstrated the common-mode feedback circuit of the Super-Regenerative Radio Frequency Receiver of the preferred embodiment of the present invention in a block diagram. In FIG. 8, the common-mode feedback circuit 510 contains a comparator and amplifier 802, feedback low-pass filter 804, and a voltage-to-current transformer 806. The comparator and amplifier 802 operates at a sub-threshold mode, and is used to compare the data signal $V_{LPF}$ and the reference common-mode voltage $V_{CM}$, to amplify the signal after the comparison, and to provide the comparison signal. The feedback low-pass filter 804 coupled to the comparator and amplifier 802 is used to filter the comparison signal and to obtain the feedback signal. The voltage-to-current transformer 806 coupled to feedback low-pass filter 804 is used to transfer the feedback signal to common-mode feedback current $I_{CMFB}$. FIG. 9 provides a further description. A detail common-mode feedback circuit of the Super-Regenerative Radio Frequency Receiver of the preferred embodiment of the present invention is depicted in FIG. 9. In the figure, the comparator and amplifier 802 contains transistors 902, 904 which are operating at the sub-threshold mode. The second source/drain of the transistor 902 and the second source/drain of the NMOS transistor 904 are coupled together. The first source/drain of the transistor 902 is coupled to a terminal of the current mirror 906. The gate of the transistor 902 is coupled to the data signal $V_{LPF}$. The first source/drain of the transistor 904 is coupled to the other terminal of the current mirror 906. The gate of the transistor 904 is coupled to the reference common-mode voltage $V_{CM}$.

Accordingly, for the comparator and amplifier 802 operates at the sub-threshold mode, the capacitor 908 of the low-pass filter 804 requires only a low capacitance so that it is feasible to build the capacitor 908 into an IC. Moreover, the common-mode feedback circuit 510 is used to define the operating point of the rectifier signal $V_{rect}$ so that the gain of the rectifier 506 can be assign a higher value, and the rectifier 506 won't be saturated.

Figure 10:
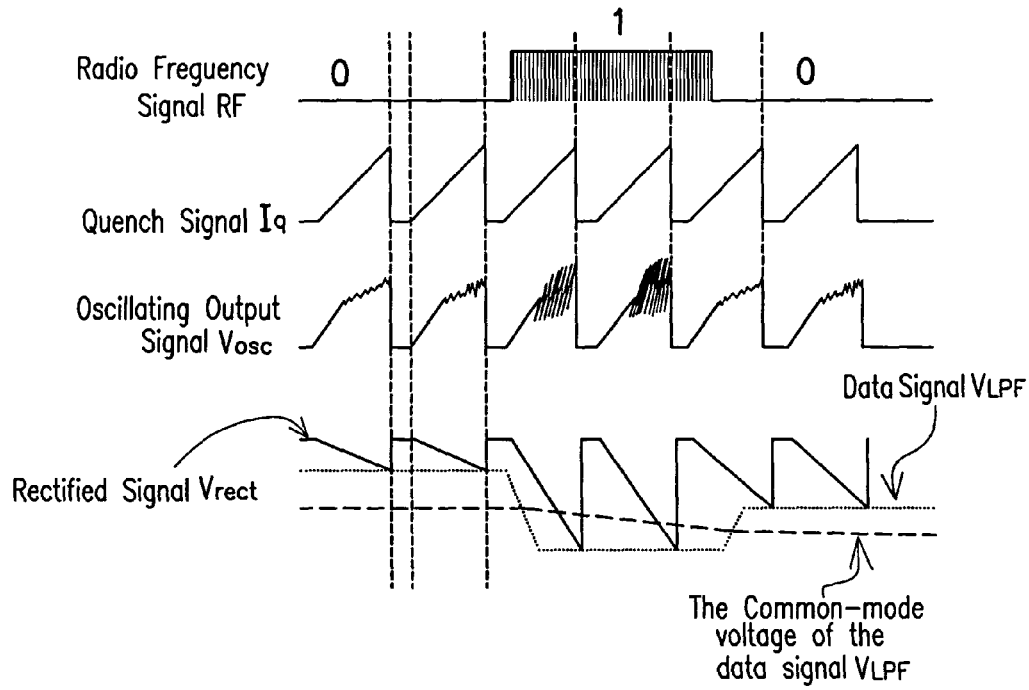
FIG. 10 depicts the Super-Regenerative Radio Frequency Receiver wave-form diagram of the preferred embodiment of the present invention before the use of the common-mode feedback circuit.

Before a use of common-mode feedback circuit, FIG. 10 demonstrates a wave-form diagram of the Super-Regenerative Radio Frequency Receiver of the preferred embodiment of the present invention. According to FIG. 10, before the use of the common-mode feedback circuit 510, the data receiving method of the Super-Regenerative Radio Frequency Receiver 50 is described as follows. First, the quench signal $I_q$ is generated by the Saw-wave generator 502. In FIG. 10, the quench signal $I_q$ is a Saw-wave signal with a frequency close to 400 kHz. Next, according to the radio frequency signal RF and the quench signal $I_q$, the oscillator 504 outputs the oscillating output signal $V_{OSC}$. It is clear to see in FIG. 10 that when the radio frequency signal RF is at a low voltage level (or at logic 0 in a binary signal), the oscillating output signal $V_{OSC}$ oscillates at a low frequency level, and when the radio frequency signal RF is at a high voltage level (or at logic 1 in a binary signal), the oscillating output signal $V_{OSC}$ oscillates at a high frequency level. According to the oscillating output signal $V_{OSC}$, the rectifier 506 provides the rectified signal $V_{rect}$ as an output. Next, rectified signal $V_{rect}$ goes through the low-pass filter 508 to form the data signal $V_{LPF}$. Finally, the data signal $V_{LPF}$ is fed to the slicer 512 to obtain the output data. According to FIG. 10, the rectified signal $V_{rect}$ and the data signal $V_{LPF}$ vary with the radio frequency signal RF, and causes the common-mode voltage of the data signal $V_{LPF}$ a bigger variation. As a consequence, the rectifier 506, the low-pass filter 508, and the slicer 512 will get saturated, and causes errors to occur at the output of the slicer 512.

Figure 11:
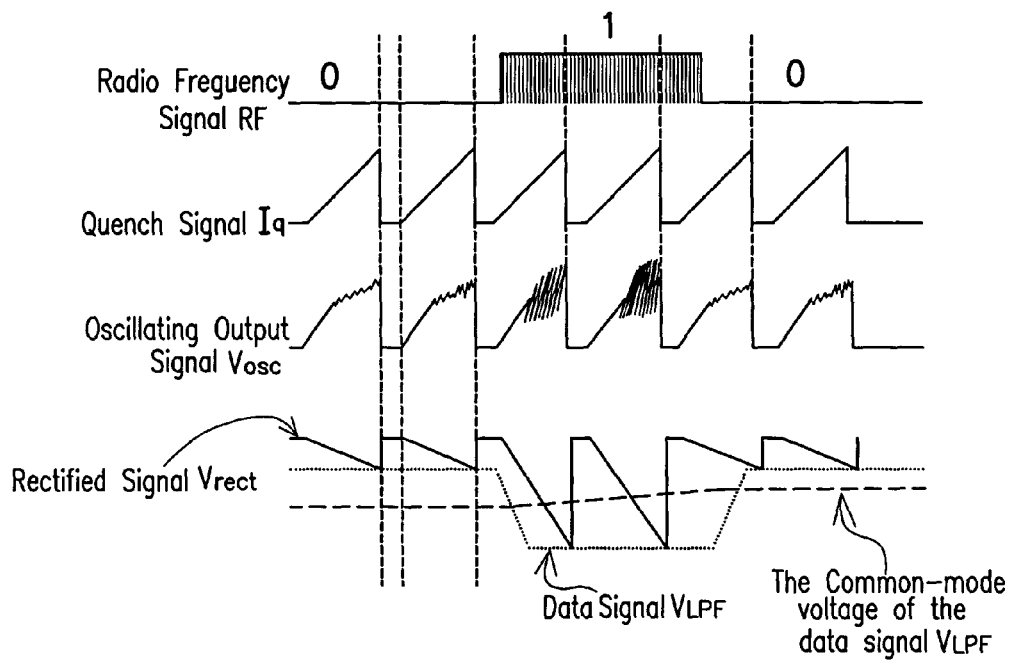
FIG. 11 depicts the Super-Regenerative Radio Frequency Receiver wave-form diagram of the preferred embodiment of the present invention after the use of the common-mode feedback circuit.

With a use of common-mode feedback circuit, FIG. 11 demonstrates a wave-form diagram of the Super-Regenerative Radio Frequency Receiver of the preferred embodiment of the present invention. According to FIG. 10, with the use of the common-mode feedback circuit 510, the data receiving method of the Super-Regenerative Radio Frequency Receiver 50 is described as follows. First, the quench signal $I_q$ is generated by the Saw-wave generator 502. Next, according to the radio frequency signal RF and the quench signal $I_q$, the oscillator 504 outputs the oscillating output signal $V_{OSC}$. The common-mode feedback circuit 510 examines the common-mode voltage of the data signal $V_{LPF}$, and feed-backs the common-mode feedback signal $I_{CMFB}$. The rectifier 506 provides the rectified signal $V_{rect}$ as an output based on the oscillating output signal $V_{OSC}$, and adjusts the common-mode voltage rectified signal $V_{rest}$ according to the common-mode feedback signal $I_{CMFB}$. Next, rectified signal $V_{rect}$ goes through the low-pass filter 508 to form the data signal $V_{LPF}$. Finally, the data signal $V_{LPF}$ is fed to the slicer 512 to obtain the output data. According to FIG. 11, the common-mode feedback voltage of the rectified signal $V_{rect}$ is adjusted by the common-mode feedback signal $I_{CMFB}$ so that the variation of the common-mode voltage of the rectified signal $V_{rect}$ is small, and the variation of the common-mode voltage of the data signal $V_{LPF}$ is small as a consequence. Therefore, the common-mode voltage of the data signal $V_{LPF}$ keeps constant. As a result, with the use of the common-mode feedback circuit 510, the rectifier 506, the low-pass filter 508, and the slicer 512 will not be saturated, and the output of the slicer 512 is correctly provided so that the sensitivity of the Super-Regenerative Radio Frequency Receiver 50 is greatly improved.

Figure 12:
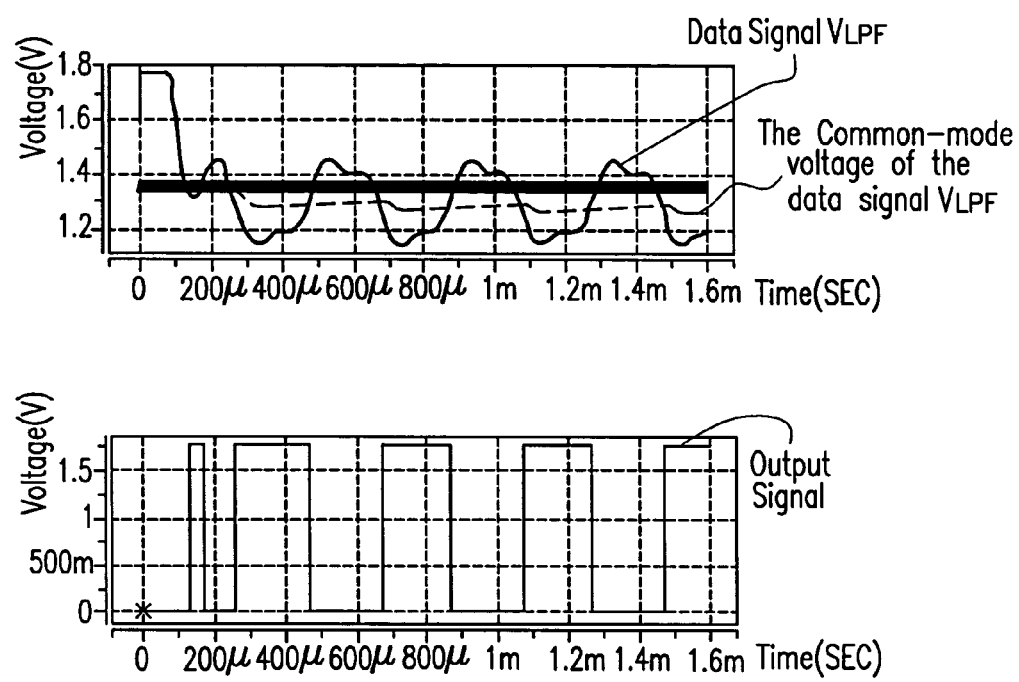
FIG. 12 depicts an actual simulated wave-form diagram of the Super-Regenerative Radio Frequency Receiver of the preferred embodiment of the present invention.

FIG. 12 provides an actual simulated waveform diagram of the Super-Regenerative Radio Frequency Receiver of the preferred embodiment of the present invention. As depicted in FIG. 13, the variation of the data signal $V_{LPF}$ is small so that the common-mode voltage of the data signal $V_{LPF}$ keeps constant, and the output data is correctly provided.

As a summary, by using a common-mode feedback circuit and by replacing the rectifier with a feedback integral-rectifier, the rectifier, the low-pass filter, and the slicer will not be saturated so that the output of the slicer is correctly generated, and the sensitivity of the Super-Regenerative Radio Frequency Receiver is greatly improved as a consequence.

It will be apparent to those skilled in the art that various modifications and variations can be made to the structure or to the methods of the preferred embodiment of the present invention without departing from the scope or spirit of the invention. In view of the foregoing, it is intended that the present invention cover modifications and variations of this invention provided they fall within the scope of the following claims and their equivalents.

What is claimed is:

1. A Super-Regenerative Radio Frequency Receiver, which comprises:
   an oscillator used for providing an oscillating output signal based on a radio frequency signal and a quench signal;
   a rectifier coupled to the oscillator and used for providing a rectified signal based on the oscillating output signal;
   a low-pass filter coupled to the rectifier and used for obtaining a data signal by low-pass filtering the rectified signal; and
   a common-mode feedback circuit coupled to the low-pass filter and the rectifier, and used for rectifying a common-mode voltage of the data signal and providing a common-mode feedback signal to the rectifier, wherein upon receiving the common-mode feedback signal the rectified signal is adjusted accordingly.

2. The Super-Regenerative Radio Frequency Receiver in claim 1, wherein the common-mode feedback signal is a common-mode feedback current, and the rectifier comprises:
   a reference current source used for providing a reference current;
   a current adder circuit coupled to the reference current source, and used for adding up the reference current and the common-mode feedback current and providing an operating current as an output; and
   a pseudo differential rectifier coupled to the current adder circuit, and used for rectifying the oscillating output signal to obtain the rectified signal, wherein the pseudo differential rectifier uses the magnitude of the operating current to adjust the voltage level of the rectified signal.

3. The Super-Regenerative Radio Frequency Receiver in claim 2, wherein the rectifier further comprises a power sink circuit, is coupled to the pseudo differential rectifier, and is used for keeping the circuit elements in the pseudo differential rectifier from being saturated.

4. The Super-Regenerative Radio Frequency Receiver in claim 2, wherein the oscillating output signal comprises a first oscillating output signal and a second oscillating output signal, and the pseudo differential rectifier comprises:
   a first transistor in which the first source/drain is coupled to the operating current and the rectified signal, the gate is coupled to the first oscillating output signal, and the second source/drain is connected to a ground reference;
   a second transistor in which the first source/drain is coupled to the operating current and the rectified signal, the gate is coupled to the second oscillating output signal, and the second source/drain is connected to the ground reference and the second source/drain of the first transistor;
   a third transistor in which the first source/drain is coupled to the operating current, the rectified signal, the first source/drain of the first transistor, and the first source/drain of the second transistor, the gate is coupled to a quench control signal, and the second source/drain is connected to a voltage power supply; and
   a capacitor comprising a first terminal and a second terminal, in which the first terminal is coupled to the quench control signal, and the second terminal is coupled to the operating current, the rectified signal, the first source/drain of the first transistor, the first source/drain of the second transistor, and the first source/drain of the third transistor.

5. The Super-Regenerative Radio Frequency Receiver in claim 1, wherein the common-mode feedback circuit comprises:
   a comparator and amplifier used to compare the data signal and a reference common-mode voltage and to amplify a comparison result, thereby to provide a comparison signal; and
   a feedback low-pass filter coupled to the comparator and amplifier, and used low-pass filtering the comparison signal to obtain a feedback signal.

6. The Super-Regenerative Radio Frequency Receiver in claim 5, wherein the common-mode feedback signal is a common-mode feedback current, and the common-mode feedback circuit further comprises a voltage-to-current transformer coupled to the feedback low-pass filter used for transferring the feedback signal to the common-mode feedback current.

7. The Super-Regenerative Radio Frequency Receiver in claim 5, wherein the comparator and amplifier operates at a sub-threshold mode.

8. The Super-Regenerative Radio Frequency Receiver in claim 5, wherein the comparator and amplifier comprises:
- a first transistor operating at the sub-threshold mode in which the first source/drain is coupled to a terminal of a current mirror, the gate is coupled to the data signal; and
- a second transistor operating at the sub-threshold mode in which the first source/drain is coupled to another terminal of the current mirror and to the comparison signal, the gate is coupled to the reference common-mode voltage, and the second source/drain is coupled to the second source/drain of the first transistor.

9. The Super-Regenerative Radio Frequency Receiver in claim 1, wherein a saw-wave generator is coupled to the oscillator to generate the quench signal.

10. The Super-Regenerative Radio Frequency Receiver in claim 1, wherein a slicer is coupled to the low-pass filter to slice the data signal and to provide an output data.

11. The Super-Regenerative Radio Frequency Receiver in claim 1, wherein the common-mode feedback signal is a common-mode feedback current.

12. The Super-Regenerative Radio Frequency Receiver in claim 1, wherein the quench signal is a quench current signal.

13. A data receiving method of Super-Regenerative Radio Frequency Receiver used for receiving a radio frequency signal to obtain a data signal, which comprises:
- providing a quench signal;
- providing an oscillating output signal according to the radio frequency signal and the quench signal;
- rectifying a common-mode voltage of the data signal, and providing a common-mode feedback signal;
- providing a rectified signal according to the oscillating output signal, and adjust the rectified signal according to the common-mode feedback signal; and
- filtering the rectified signal to obtain the data signal.

14. The data receiving method in claim 13, wherein the common-mode feedback signal is a common-mode feedback current, and the process of obtaining the rectified signal comprises:
- providing a reference current;
- providing a operating current by adding the reference current and the common-mode feedback current up; and
- rectifying the oscillating output signal to obtain the rectified signal, and using the magnitude of the operating current to adjust the output voltage level of the rectified signal.

15. The data receiving method in claim 13, wherein the procedure for rectifying the common-mode voltage of the data signal and providing the common-mode feedback signal comprises:
- providing a reference common-mode voltage;
- comparing the data signal and the reference common-mode voltage, amplifying the comparison results, and outputting a comparison signal; and
- filtering the comparison signal to obtain a feedback signal.

16. The data receiving method in claim 15, wherein the common-mode feedback signal is a common-mode feedback current, and the procedure for rectifying the common-mode voltage of the data signal and providing the common-mode feedback signal further comprises:
- transferring the feedback signal to the common-mode feedback current.

* * * * *